(12) United States Patent
Peng et al.

(10) Patent No.: US 9,525,037 B2
(45) Date of Patent: Dec. 20, 2016

(54) FABRICATING METHOD OF TRENCH GATE METAL OXIDE SEMICONDUCTOR FIELD EFFECT TRANSISTOR

(71) Applicant: UNITED MICROELECTRONICS CORPORATION, Hsinchu (TW)

(72) Inventors: Chun-Hong Peng, Hsinchu (TW); Yu-Hsi Lai, Hualien (TW)

(73) Assignee: UNITED MICROELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 14/754,636

(22) Filed: Jun. 29, 2015

(65) Prior Publication Data

US 2015/0318366 A1 Nov. 5, 2015

Related U.S. Application Data

(62) Division of application No. 13/654,432, filed on Oct. 18, 2012, now abandoned.

(51) Int. Cl.

| H01L 21/3205 | (2006.01) |
|---|---|
| H01L 29/423 | (2006.01) |
| H01L 21/308 | (2006.01) |
| H01L 21/306 | (2006.01) |
| H01L 21/311 | (2006.01) |
| H01L 21/321 | (2006.01) |
| H01L 21/28 | (2006.01) |
| H01L 21/02 | (2006.01) |

(Continued)

(52) U.S. Cl.
CPC ....... *H01L 29/4236* (2013.01); *H01L 21/0217* (2013.01); *H01L 21/0223* (2013.01); *H01L 21/02164* (2013.01); *H01L 21/28035* (2013.01); *H01L 21/3081* (2013.01); *H01L 21/30604* (2013.01); *H01L 21/31105* (2013.01); *H01L 21/32115* (2013.01); *H01L 29/42376* (2013.01); *H01L 29/66734* (2013.01); *H01L 29/7809* (2013.01); *H01L 29/7813* (2013.01); *H01L 21/02255* (2013.01); *H01L 29/0653* (2013.01)

(58) Field of Classification Search
CPC .......... H01L 29/4236; H01L 21/28035; H01L 21/0223; H01L 21/0217; H01L 21/3081; H01L 21/31105; H01L 21/02164; H01L 21/30604; H01L 21/32115; H01L 29/42376; H01L 29/7813; H01L 29/7809; H01L 29/66734; H01L 21/02255; H01L 29/065
USPC .......................................... 257/330; 438/667
See application file for complete search history.

(56) References Cited

U.S. PATENT DOCUMENTS

| 4,344,081 A | 8/1982 | Pao |
|---|---|---|
| 4,396,999 A | 8/1983 | Malaviya |

(Continued)

FOREIGN PATENT DOCUMENTS

| TW | 200939472 | 9/2009 |
|---|---|---|
| TW | 201214533 | 4/2012 |

*Primary Examiner* — Thanh Y Tran
*Assistant Examiner* — Mohammad M Hoque
(74) *Attorney, Agent, or Firm* — Ding Yu Tan

(57) ABSTRACT

A trench gate metal oxide semiconductor field effect transistor includes a substrate and a gate. The substrate has a trench. The trench is extended downwardly from a surface of the substrate. The gate includes an insertion portion and a symmetrical protrusion portion. The insertion portion is embedded in the trench. The symmetrical protrusion portion is symmetrically protruded over the surface of the substrate.

11 Claims, 7 Drawing Sheets

(51) Int. Cl.
*H01L 29/66* (2006.01)
*H01L 29/78* (2006.01)
*H01L 29/06* (2006.01)

(56) References Cited

U.S. PATENT DOCUMENTS

| | | | |
|---|---|---|---|
| 4,893,160 A | 1/1990 | Blanchard | |
| 4,918,333 A | 4/1990 | Anderson | |
| 4,958,089 A | 9/1990 | Fitzpatrick | |
| 5,016,065 A | 5/1991 | Seki | |
| 5,016,068 A | 5/1991 | Mori | |
| 5,040,045 A | 8/1991 | McArthur | |
| 5,071,782 A | 12/1991 | Mori | |
| 5,124,761 A | 6/1992 | Senuma | |
| 5,124,764 A | 6/1992 | Mori | |
| 5,126,807 A | 6/1992 | Baba | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,614,751 A | 3/1997 | Yilmaz | |
| 5,698,893 A | 12/1997 | Perera | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,077,733 A * | 6/2000 | Chen | H01L 21/28114 257/E21.193 |
| 6,124,611 A | 9/2000 | Mori | |
| 6,144,538 A | 11/2000 | Chao | |
| 6,165,846 A | 12/2000 | Carns | |
| 6,184,142 B1 * | 2/2001 | Chung | H01L 21/31144 216/51 |
| 6,204,123 B1 | 3/2001 | Mori | |
| 6,245,689 B1 | 6/2001 | Hao | |
| 6,271,128 B1 * | 8/2001 | Tseng | H01L 29/66583 257/E21.205 |
| 6,277,675 B1 | 8/2001 | Tung | |
| 6,277,757 B1 | 8/2001 | Lin | |
| 6,297,108 B1 | 10/2001 | Chu | |
| 6,306,700 B1 | 10/2001 | Yang | |
| 6,326,283 B1 | 12/2001 | Liang | |
| 6,353,247 B1 | 3/2002 | Pan | |
| 6,388,292 B1 | 5/2002 | Lin | |
| 6,400,003 B1 | 6/2002 | Huang | |
| 6,403,456 B1 * | 6/2002 | Plat | H01L 21/28114 257/E21.205 |
| 6,424,005 B1 | 7/2002 | Tsai | |
| 6,514,830 B1 | 2/2003 | Fang | |
| 6,521,538 B2 | 2/2003 | Soga | |
| 6,614,089 B2 | 9/2003 | Nakamura | |
| 6,713,794 B2 | 3/2004 | Suzuki | |
| 6,762,098 B2 | 7/2004 | Hshieh | |
| 6,764,890 B1 | 7/2004 | Xu | |
| 6,784,060 B2 | 8/2004 | Ryoo | |
| 6,784,490 B1 | 8/2004 | Inoue | |
| 6,819,184 B2 | 11/2004 | Pengelly | |
| 6,822,296 B2 | 11/2004 | Wang | |
| 6,825,531 B1 | 11/2004 | Mallikarjunaswamy | |
| 6,833,584 B2 | 12/2004 | Henninger | |
| 6,846,729 B2 | 1/2005 | Andoh | |
| 6,855,581 B2 | 2/2005 | Roh | |
| 6,855,980 B2 | 2/2005 | Wang | |
| 6,869,848 B2 | 3/2005 | Kwak | |
| 6,894,349 B2 | 5/2005 | Beasom | |
| 6,958,515 B2 | 10/2005 | Hower | |
| 7,008,832 B1 * | 3/2006 | Subramanian | H01L 21/28114 257/E21.205 |
| 7,015,116 B1 | 3/2006 | Lo | |
| 7,023,050 B2 | 4/2006 | Salama | |
| 7,037,788 B2 | 5/2006 | Ito | |
| 7,075,575 B2 | 7/2006 | Hynecek | |
| 7,091,079 B2 | 8/2006 | Chen | |
| 7,148,540 B2 | 12/2006 | Shibib | |
| 7,214,591 B2 | 5/2007 | Hsu | |
| 7,309,636 B2 | 12/2007 | Chen | |
| 7,323,740 B2 | 1/2008 | Park | |
| 7,358,567 B2 | 4/2008 | Hsu | |
| 7,427,552 B2 | 9/2008 | Jin | |
| 7,622,764 B2 | 11/2009 | Jung | |
| 8,232,610 B2 | 7/2012 | Nakazawa | |
| 8,652,763 B2 * | 2/2014 | Jain | H01L 21/0277 430/314 |
| 2002/0158277 A1 | 10/2002 | Harada | |
| 2003/0022460 A1 | 1/2003 | Park | |
| 2004/0018698 A1 | 1/2004 | Schmidt | |
| 2004/0070050 A1 | 4/2004 | Chi | |
| 2005/0227448 A1 | 10/2005 | Chen | |
| 2005/0258496 A1 | 11/2005 | Tsuchiko | |
| 2006/0035437 A1 | 2/2006 | Mitsuhira | |
| 2006/0261407 A1 | 11/2006 | Blanchard | |
| 2006/0270134 A1 | 11/2006 | Lee | |
| 2006/0270171 A1 | 11/2006 | Chen | |
| 2007/0041227 A1 | 2/2007 | Hall | |
| 2007/0082440 A1 | 4/2007 | Shiratake | |
| 2007/0132033 A1 | 6/2007 | Wu | |
| 2007/0138566 A1 | 6/2007 | Suzuki | |
| 2007/0273001 A1 | 11/2007 | Chen | |
| 2008/0160697 A1 | 7/2008 | Kao | |
| 2008/0160706 A1 | 7/2008 | Jung | |
| 2008/0185629 A1 | 8/2008 | Nakano | |
| 2008/0185642 A1 | 8/2008 | Montgomery | |
| 2008/0296655 A1 | 12/2008 | Lin | |
| 2008/0315346 A1 | 12/2008 | Lerner | |
| 2009/0065861 A1 * | 3/2009 | Bhalla | H01L 29/1095 257/331 |
| 2009/0108348 A1 | 4/2009 | Yang | |
| 2009/0111252 A1 | 4/2009 | Huang | |
| 2009/0159966 A1 | 6/2009 | Huang | |
| 2009/0176342 A1 * | 7/2009 | Lee | H01L 21/26586 438/270 |
| 2009/0197380 A1 * | 8/2009 | Lee | H01L 29/66727 438/270 |
| 2009/0233409 A1 * | 9/2009 | Yamaguchi | H01L 29/7827 438/270 |
| 2009/0278208 A1 | 11/2009 | Chang | |
| 2009/0294865 A1 | 12/2009 | Tang | |
| 2009/0294870 A1 | 12/2009 | Arai | |
| 2010/0006937 A1 | 1/2010 | Lee | |
| 2010/0032758 A1 | 2/2010 | Wang | |
| 2010/0096702 A1 | 4/2010 | Chen | |
| 2010/0148250 A1 | 6/2010 | Lin | |
| 2010/0213517 A1 | 8/2010 | Sonsky | |
| 2011/0057263 A1 | 3/2011 | Tang | |
| 2011/0254082 A1 * | 10/2011 | Jang | H01L 21/84 257/330 |
| 2012/0061748 A1 | 3/2012 | Kobayashi | |
| 2012/0129306 A1 * | 5/2012 | Hu | H01L 29/7813 438/270 |
| 2012/0217513 A1 | 8/2012 | Tega | |

* cited by examiner

FABRICATING METHOD OF TRENCH GATE METAL OXIDE SEMICONDUCTOR FIELD EFFECT TRANSISTOR

CROSS REFERENCE

This application is a divisional application of a U.S. patent application Ser. No. 13/654,432, filed on Oct. 18, 2012, which application is incorporated by reference herein in its entirety.

FIELD OF THE INVENTION

The present invention relates to a semiconductor device and a fabricating method thereof, and more particularly to a trench gate metal oxide semiconductor field effect transistor and a fabricating method thereof.

BACKGROUND OF THE INVENTION

A conventional trench gate metal oxide semiconductor field effect transistor comprises a gate structure, which is disposed within a trench. For fabricating the conventional trench gate metal oxide semiconductor field effect transistor, a trench is firstly formed in a semiconductor substrate, and then a gate dielectric layer is formed on a sidewall of the trench by thermal oxidation. Then, a polysilicon semiconductor material is filled into the trench. After a planarization process is performed, a polysilicon gate is formed in the trench.

Recently, since the integrated circuit becomes more complicated, the feature size and wiring space of the semiconductor device are gradually decreased, and the size of the polysilicon gate is reduced. After the polysilicon gate is formed, a metal contact plug is formed on the polysilicon gate in the subsequent process. As known, the size reduction of the polysilicon gate may result in misalignment between the polysilicon gate and the metal contact plug. If the metal contact plug is deviated because of misalignment, the metal contact plug and the neighboring circuits may be suffered from charge breakdown.

Therefore, there is a need of providing an improved trench gate metal oxide semiconductor field effect transistor and a fabricating method thereof in order to obviate the drawbacks encountered from the prior art.

SUMMARY OF THE INVENTION

In accordance with an aspect, the present invention provides a trench gate metal oxide semiconductor field effect transistor. The trench gate metal oxide semiconductor field effect transistor includes a substrate and a gate. The substrate has a trench. The trench is extended downwardly from a surface of the substrate. The gate includes an insertion portion and a symmetrical protrusion portion. The insertion portion is embedded in the trench. The symmetrical protrusion portion is symmetrically protruded over the surface of the substrate.

In an embodiment, the symmetrical protrusion portion is wider than the trench.

In an embodiment, the gate is a T-shaped gate, which is symmetrical with respect to a central line of the trench.

In an embodiment, the trench has a width smaller than or equal to 0.8 μm and a depth of about 1.6 μm.

In an embodiment, the trench gate metal oxide semiconductor field effect transistor includes a dielectric material layer and a contact plug. The dielectric material layer is disposed over the surface of the substrate and the gate. The contact plug is penetrated through the dielectric material layer and electrically contacted with the symmetrical protrusion portion of the gate.

In an embodiment, the trench gate metal oxide semiconductor field effect transistor includes a first-conductive doped region, a second-conductive doped region, a gate dielectric layer, and a source region. The first-conductive doped region is formed in the substrate. The second-conductive doped region is formed in the substrate. A P/N junction is formed between the first-conductive doped region and the second-conductive doped region. The trench is extended downwardly from the surface of the trench, penetrated through the first-conductive doped region and the P/N junction, and inserted into the second-conductive doped region. The gate dielectric layer is formed on a sidewall of the trench. The source region is formed in the substrate and located beside the gate dielectric layer.

In an embodiment, the first-conductive doped region is a P-type body region, and the second-conductive doped region is an N-type well region.

In an embodiment, the trench gate metal oxide semiconductor field effect transistor further includes an N-type buried layer, which is disposed under the second-conductive doped region.

In an embodiment, the source region is an N-type well region, and the source region is extended from the surface of the substrate into the first-conductive doped region.

In accordance with an aspect, the present invention provides a method for fabricating a trench gate metal oxide semiconductor field effect transistor. The method includes the following steps. Firstly, a substrate is provided. Then, a hard mask layer is formed on the substrate. Then, an etching process is performed to remove a part of the hard mask layer and form a trench in the substrate. Then, an etching back process is performed to remove a part of the hard mask layer. Then, a conductive layer is formed on the hard mask layer and filled into the trench. Then, a planarization process is performed to remove the conductive layer by using the hard mask layer as a stop layer.

In an embodiment, before the hard mask layer is formed, the method further includes a step of forming a pad silicon oxide layer on the substrate.

In an embodiment, after the hard mask layer is formed, the method further includes a step of forming a sacrificial layer on the hard mask layer.

In an embodiment, before the conductive layer is formed, the method further comprises a step of forming a gate dielectric layer on a sidewall of the trench by a thermal oxidation process.

In an embodiment, the hard mask layer is a silicon oxide layer or a silicon nitride layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1F are schematic cross-sectional views illustrating a method for fabricating a trench gate metal oxide semiconductor field effect transistor according to an embodiment of the present invention. The method for fabricating the trench gate metal oxide semiconductor field effect transistor 100 comprises the following steps.

Figure 1A:
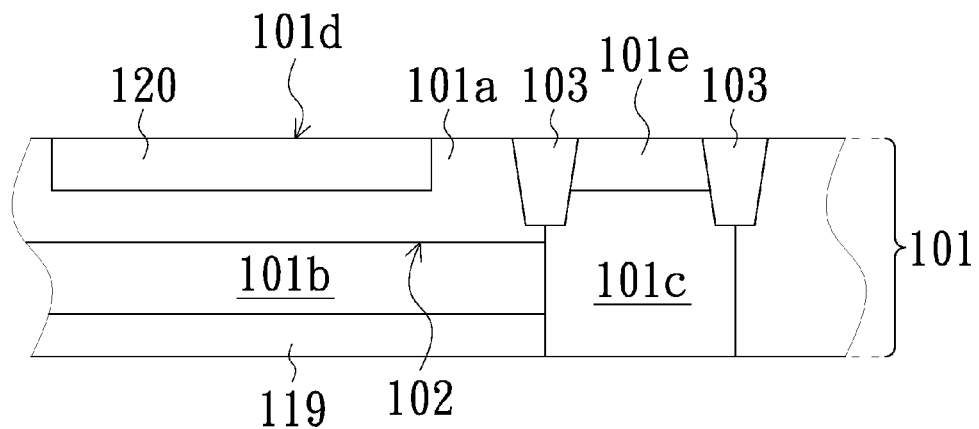
FIGS. 1A~1F are schematic cross-sectional views illustrating a method for fabricating a trench gate metal oxide semiconductor field effect transistor according to an embodiment of the present invention.

Firstly, as shown in FIG. 1A, a substrate 101 is provided. In an embodiment, the substrate 101 is a silicon substrate. In addition, the substrate 101 comprises a first-conductive doped region 101a, a second-conductive doped region 101b, a source region 120, and a second-conductive deep well region 101c.

The first-conductive doped region 101a, the second-conductive doped region 101b, the source region 120 and the second-conductive deep well region 101c are formed in the substrate 101 by a plurality of ion implantation processes. The second-conductive doped region 101b is formed in the substrate 101. The first-conductive doped region 101a is disposed over the second-conductive doped region 101b, and extended downwardly from a surface 101d of the substrate 101 to be contacted with the second-conductive doped region 101b. Consequently, a P/N junction 102 is formed between the first-conductive doped region 101a and the second-conductive doped region 101b. The source region 120 is extended downwardly from the surface 101d of the substrate 101, and formed in the first-conductive doped region 101a. The second-conductive deep well region 101c is formed in the substrate 101, and extended downwardly from the surface 101d of the substrate 101, serving as the drain of the trench gate metal oxide semiconductor field effect transistor 100. Moreover, the second-conductive deep well region 101c is contacted with the second-conductive doped region 101b. Furthermore, a buried layer 119 with the same conductivity as the second-conductive doped region 101b is disposed under the second-conductive doped region 101b.

In this embodiment, the second-conductive doped region 101b is an N-type well region with a lower dopant concentration. The first-conductive doped region 101a is a P-type body region. The source region 120 is an N-type well region with a higher dopant concentration. The second-conductive deep well region 101c is an N-type deep well region. The second-conductive deep well region 101c is isolated from the first-conductive doped region 101a through a shallow trench isolation structure 103. The buried layer 119 is an N-type doped region with a higher dopant concentration. The buried layer 119 is disposed under the second-conductive doped region 101b and contacted with the second-conductive deep well region 101c. Preferably, an N-type well region 101e with a dopant concentration greater than that of the N-type (second-conductive) deep well region 101c, maybe formed in the N-type (second-conductive) deep well region 101c, and extended downwardly from the surface 101d of the substrate 101.

Figure 1B:
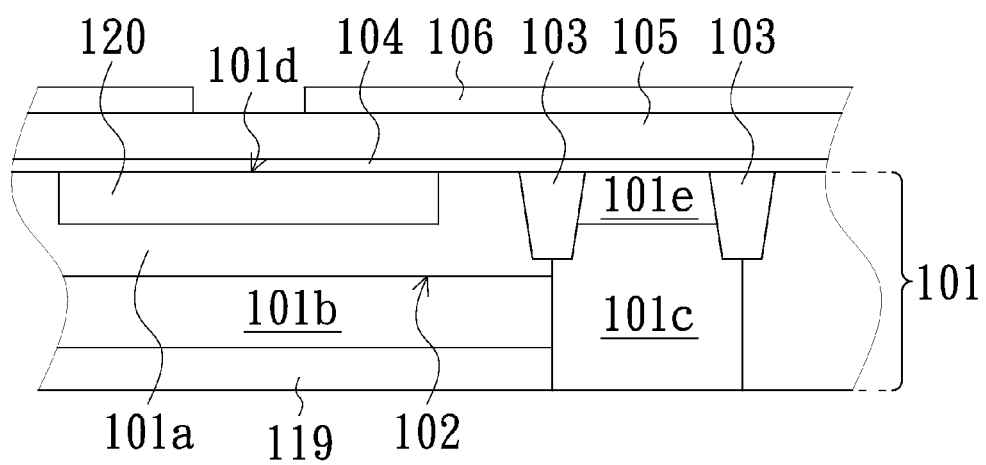

Then, as shown in FIG. 1B, by film deposition processes or any other suitable processes, a pad silicon oxide layer 104, a hard mask layer 105 and a patterned photoresist layer 106 are formed on the surface 101d of the substrate 101 to cover the second-conductive deep well region 101c, the source region 120 and the first-conductive doped region 101a. For example, the hard mask layer 105 is made of silicon nitride. Alternatively, the hard mask layer 105 may be made of silicon oxide.

Figure 1C:
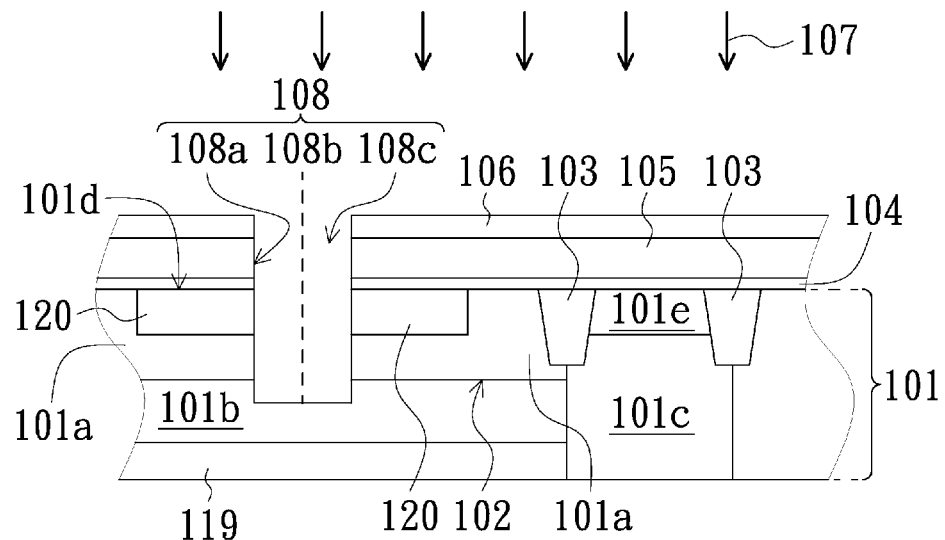

Then, as shown in FIG. 1C, by using the patterned photoresist layer 106 as an etching mask, an etching process 107 is performed to remove a part of the hard mask layer 105, a part of the pad silicon oxide layer 104 and a part of the substrate 101. Consequently, a trench 108 is formed in the substrate 101. The trench 108 is extended downwardly from the surface 101d of the substrate 101, penetrated through the source region 120, and extended into the second-conductive doped region 101b. For example, the etching process 107 is a dry etching process. The trench 108 has a width smaller than or equal to 0.8 μm and a depth of about 1.6 μm.

Figure 1D:
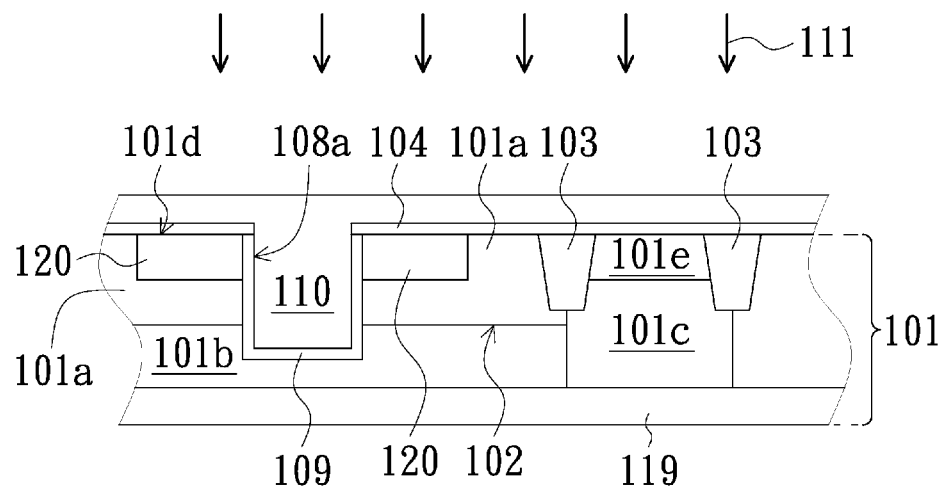
Figure 1E:
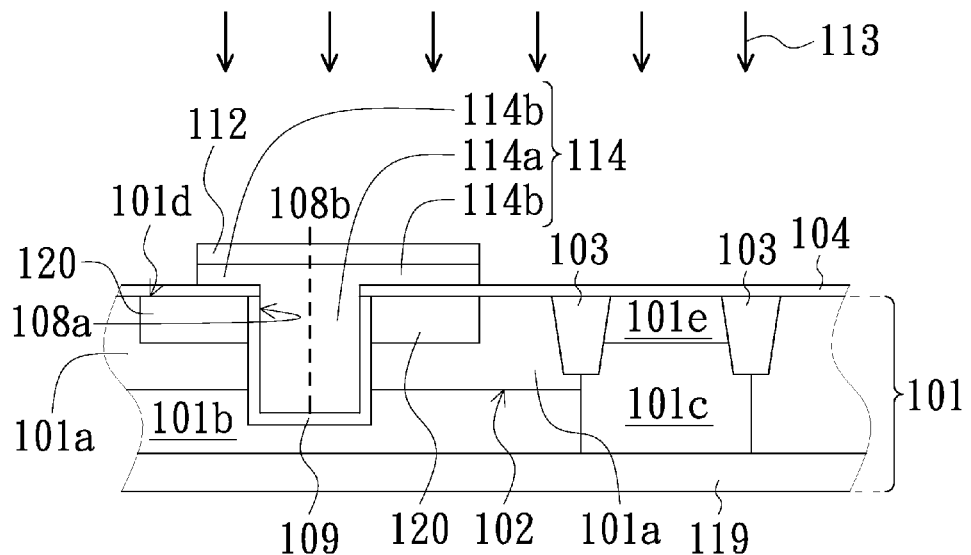

After the patterned photoresist layer 106 and the remaining hard mask layer 105 are removed, a thermal oxidation process is performed to form a gate dielectric layer 109 on a sidewall 108a of the trench 108 (see FIG. 1D). Then, a conductive layer, preferably a polysilicon layer 110, is formed on the pad silicon oxide layer 104, and filled into the trench 108. Then, a planarization process 111 (e.g. a chemical mechanical polishing process) is performed to partially remove the polysilicon layer 110.

After the planarization process 111 is performed, a patterned photoresist layer 112 is formed on the polysilicon layer 110. By using the pad silicon oxide layer 104 as an etch stop layer, another etching process 113 is performed to remove a part of the planarized polysilicon layer 110. Consequently, a T-shaped portion of the planarized polysilicon layer 110 is remained and serves as a T-shaped polysilicon gate 114 of the trench gate metal oxide semiconductor field effect transistor 100 (see FIG. 1E). The T-shaped polysilicon gate 114 comprises an insertion portion 114a and a protrusion portion 114b. The insertion portion 114a is embedded in the trench 108. The protrusion portion 114b is protruded over the surface 101d of the substrate 101 and externally and transversely extended from a central line 108b of the trench 108.

Figure 1F:
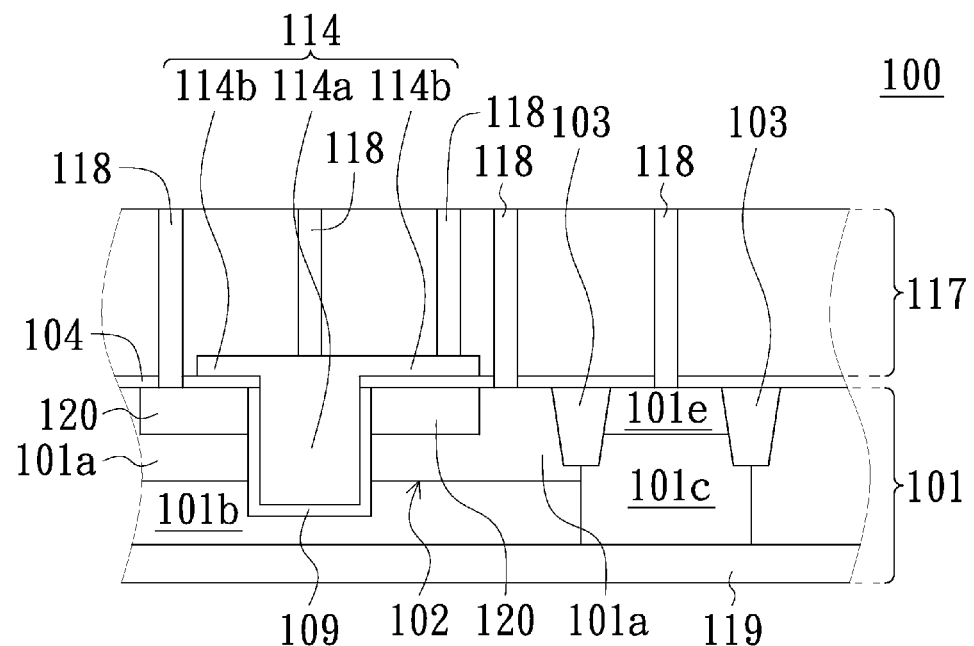

Then, a metal interconnection process is performed. Consequently, a dielectric material layer 117 is firstly formed over the surface 101d of the substrate 101 and the polysilicon gate 114, and then a plurality of metal contact plugs 118 are formed in the dielectric material layer 117. Meanwhile, the trench gate metal oxide semiconductor field effect transistor 100 is produced. The resulting structure of the trench gate metal oxide semiconductor field effect transistor 100 is shown in FIG. 1F.

Please refer to FIG. 1F again. In the T-shaped polysilicon gate 114, the transversely-extending width of the protrusion portion 114b is greater than the width of the insertion portion 114a. Consequently, the protrusion portion 114b can provide a larger process window for the subsequently forming of the metal contact plug 118 on the polysilicon gate 114.

However, the above-mentioned method for fabricating the trench gate metal oxide semiconductor field effect transistor 100 still has some drawbacks. For example, since two photolithography and etching processes are required to form the polysilicon gate 114, every misalignment error of the photomask may further decrease the alignment accuracy. Moreover, during the performing of the etching process 113, the surface 101d of the substrate 101 is still completely covered by the planarized polysilicon layer 110. Since the alignment mark for the etching process 113 is possibly hindered by the planarized polysilicon layer 110, the misalignment error of the photomask is thereby increased. Due to the misalignment error of the photomask, the protrusion portion 114b of the polysilicon gate 114 may be unexpectedly and asymmetrically extended in the transverse direction. If the (alignment) process errors in the process of forming the metal contact plug 118 are taken into consideration, the total cumulative misalignment error of the semiconductor device is very large. Under this circumstance, the metal contact plug 118 and the neighboring circuits may be suffered from charge breakdown.

For solving the above drawbacks, the method of forming the polysilicon gate 114 needs to be further improved.

FIGS. 2A~2E are schematic cross-sectional views illustrating a method for fabricating a trench gate metal oxide semiconductor field effect transistor according to another embodiment of the present invention. The method for fabricating the trench gate metal oxide semiconductor field effect transistor 200 comprises the following steps.

Figure 2A:
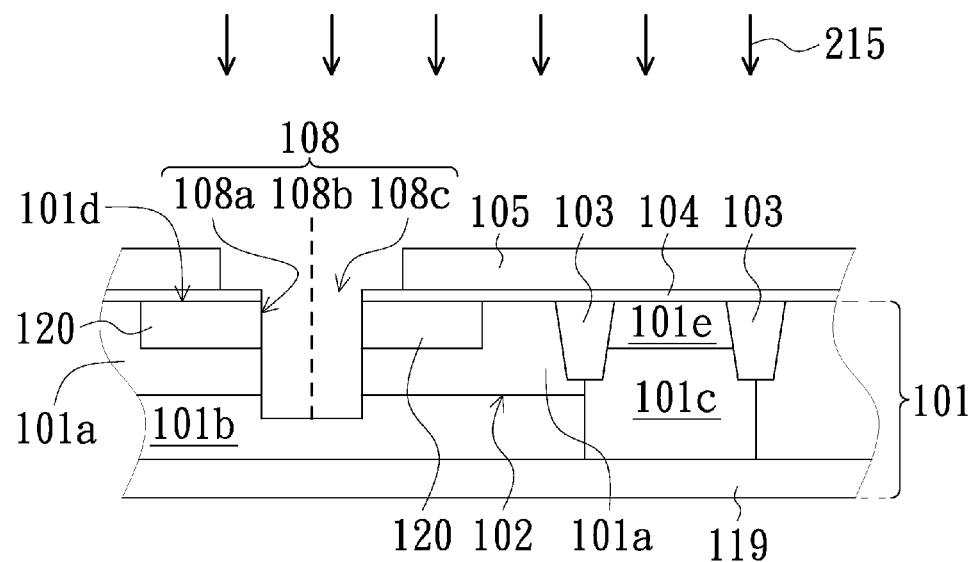
FIGS. 2A~2E are schematic cross-sectional views illustrating a method for fabricating a trench gate metal oxide semiconductor field effect transistor according to another embodiment of the present invention.

Firstly, the steps as shown in FIGS. 1A, 1B and 1C are sequentially performed. After the trench 108 is formed (see FIG. 1C), the remaining hard mask layer 105 is not removed immediately. On the other hand, as shown in FIG. 2A according to the embodiment of present invention, after the patterned photoresist layer 106 is removed, an etching back process 215 is performed to remove the patterned photoresist layer 106 and a part of the hard mask layer 105, and a part of the pad silicon oxide layer 104 at an entrance 108c of the trench 108 that is exposed. In an embodiment, the hard mask layer 105 is made of silicon nitride, and the etching back process 215 is a wet etching process by using a phosphoric acid solution as an etchant solution to remove a part of the hard mask layer 105. Alternatively, in another embodiment, the hard mask layer 105 is made of silicon dioxide, and the etching back process 215 is a wet etching process by using a buffer oxide etcher (BOE) solution as an etchant solution to remove a part of the hard mask layer 105.

Figure 3:
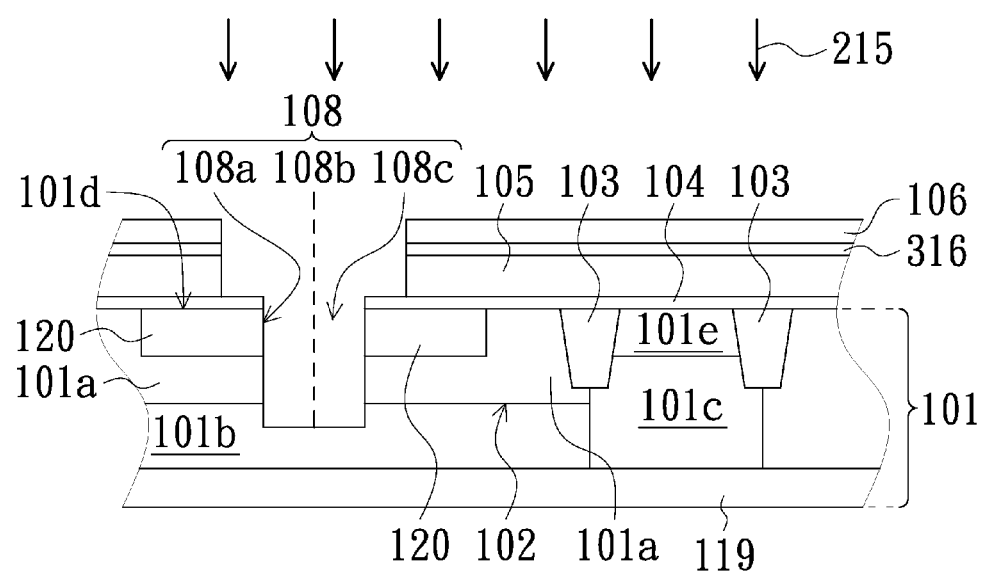
FIG. 3 is a schematic cross-sectional view illustrating an optional step of the method for fabricating the trench gate metal oxide semiconductor field effect transistor of the present invention.

Furthermore, for improved control of the etching back process 215, before the patterned photoresist layer 106 is formed, another silicon dioxide layer 316 may be optionally formed on the hard mask layer 105 (see FIG. 3). The silicon dioxide layer 316 is served as a sacrificial layer for the etching back process 215 in order to adjust the etching depth and range of the etching back process 215.

Figure 2B:
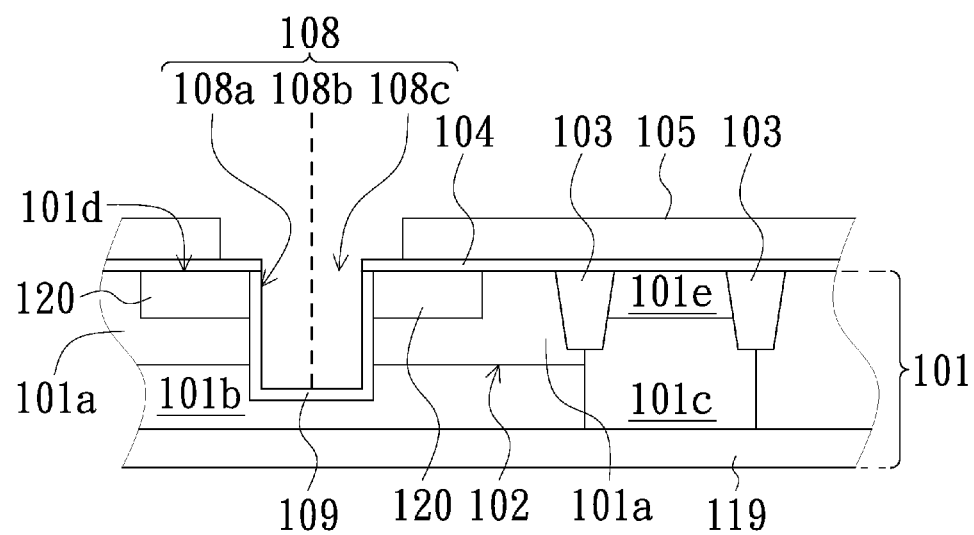
Figure 2C:
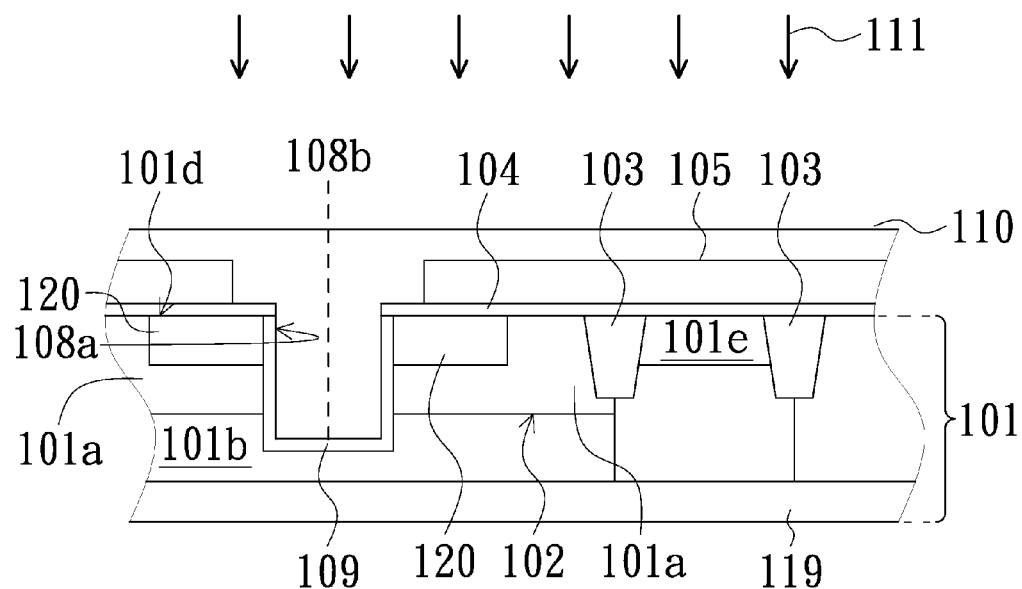
Figure 2D:
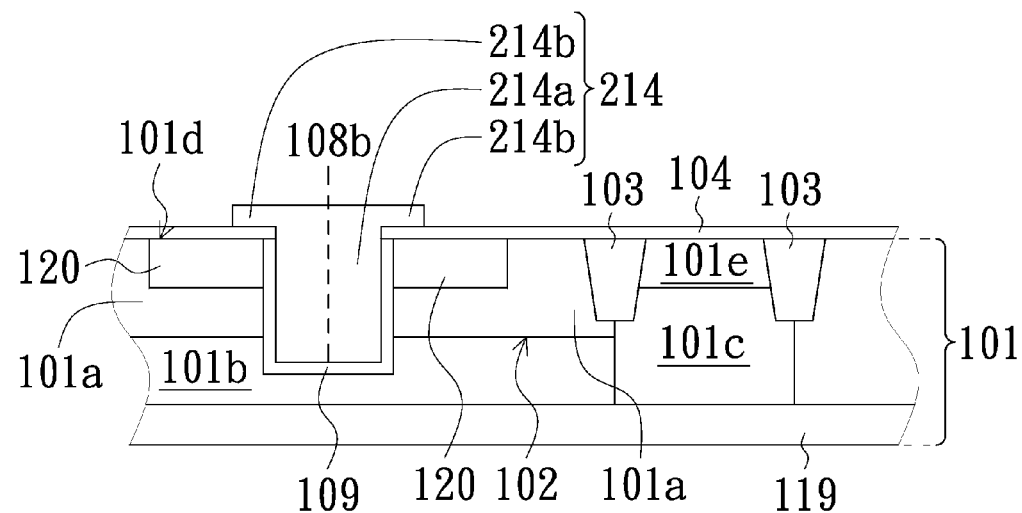

Then, a thermal oxidation process is performed to form a gate dielectric layer 109 on a sidewall 108a of the trench 108 (see FIG. 2B). Then, as shown in FIG. 2C, a polysilicon layer 110 is formed on the remaining hard mask layer 105 and the exposed pad silicon oxide layer 104, and filled into the trench 108.

Then, a planarization process 111 (e.g. a chemical mechanical polishing process) is performed to remove the polysilicon layer 110 by using the hard mask layer 105 as a polish stop layer. After the remaining hard mask layer 105 is removed, a T-shaped polysilicon gate 214 is formed (see FIG. 2D). The T-shaped polysilicon gate 214 is configured symmetrical with respect to a central line 108b of the trench 108. The T-shaped polysilicon gate 214 comprises an insertion portion 214a and a symmetrical protrusion portion 214b. The insertion portion 214a is embedded in the trench 108. The symmetrical protrusion portion 214b is protruded over the surface 101d of the substrate 101, symmetrical with respect to the central line 108b of the trench 108, and externally and transversely extended from the central line 108b of the trench 108.

Figure 2E:
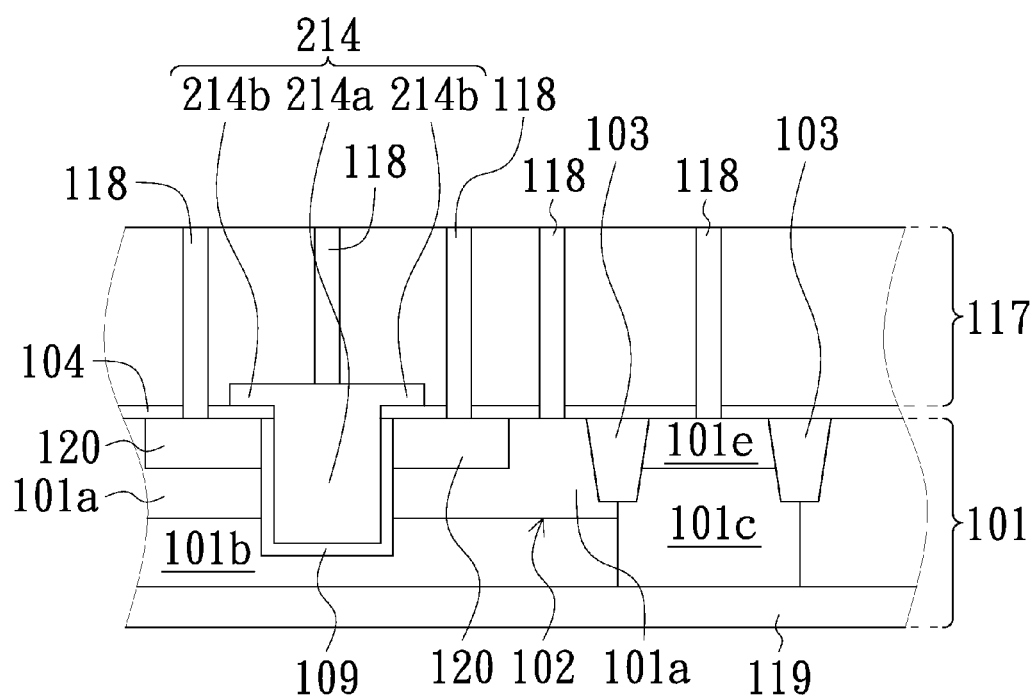

Then, a metal interconnection process is performed. Consequently, a dielectric material layer 117 is firstly formed over the surface 101d of the substrate 101 and the polysilicon gate 214, and then a plurality of metal contact plugs 118 are formed in the dielectric material layer 117. Meanwhile, the trench gate metal oxide semiconductor field effect transistor 200 is produced. The resulting structure of the trench gate metal oxide semiconductor field effect transistor 200 is shown in FIG. 2E.

From the above discussions, the structure of the polysilicon gate 214 of the trench gate metal oxide semiconductor field effect transistor 200 is improved in comparison to the trench gate MOSFET 100 shown in FIGS. 1A~1F. For forming the polysilicon gate 214, a part of the hard mask layer 105 at the entrance 108c of the trench 108 is firstly removed by an etching back process (e.g. an anisotropic etching process) (see FIG. 2A) then the polysilicon layer 110 is filled into the trench 108, and finally a planarization process is performed. Consequently, the symmetrical protrusion portion 214b of the polysilicon gate 214 can be symmetrically configured with respect to the central line 108b of the trench 108 and transversely extended from the central line 108b of the trench 108 (see FIG. 2D). The symmetrical protrusion portion 114b can provide a larger process window for subsequently forming of the metal contact plug 118 on the polysilicon gate 214. Consequently, even if the feature size of the semiconductor device is shrunken down, the misalignment error thereof will be largely reduced.

Moreover, according to the embodiments of the fabricating method of the present invention, only a single photolithography and etching process is sufficient to form a polysilicon gate, instead of requiring two photolithography and etching processes to form the same. Consequently, the fabricating method of the present invention is simplified, the photomask number is reduced, and the misalignment error of the semiconductor device is largely reduced. Since the misalignment error is largely reduced, the symmetrical protrusion portion of the polysilicon gate is no longer unexpectedly and asymmetrically extended in the transverse direction, and the total cumulative misalignment error of the semiconductor device is reduced.

From the above discussions, the present invention provides a trench gate metal oxide semiconductor field effect transistor and a fabricating method thereof. The fabricating method comprises the following steps. Firstly, a substrate is provided. Then, a hard mask layer is formed on the substrate. Then, an etching process is performed to remove a part of the hard mask layer and form a trench in the substrate. Then, an etching back process is performed to remove a part of the hard mask layer. Then, a polysilicon layer is formed on the hard mask layer and filled into the trench. Then, by using the hard mask layer as a stop layer, a planarization process is performed to remove the polysilicon layer. Consequently, a polysilicon gate with the symmetrical protrusion portion is formed.

The symmetrical protrusion portion of the polysilicon gate can provide a larger process window for subsequently forming the metal contact plug on the polysilicon gate. Consequently, even if the feature size of the device is shrunken down, the misalignment error will be largely reduced.

From the above descriptions, the symmetrical protrusion portion of the polysilicon gate is formed by etching back the hard mask layer to widen the entrance of the trench and then filling the polysilicon layer. Consequently, it is not necessary to perform an additional photolithography and etching process. In other words, the fabricating method of the present invention is simplified and cost-effective. Since it is not necessary to repeatedly use the photomask for alignment, the precision of the alignment between the metal contact plug and the polysilicon gate is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a trench gate metal oxide semiconductor field effect transistor, the method comprising steps of:
    providing a substrate having a source region;
    forming an oxide layer on the substrate;
    forming a hard mask layer on the oxide layer;
    performing an etching process to remove a part of the hard mask layer, a part of the oxide layer, a part of the substrate to form a trench in the substrate penetrating the source region;
    performing an etching back process to remove a part of the remaining hard mask layer to expose a part of the oxide layer;
    performing a thermal oxidation process to form a gate dielectric layer only on a sidewall of the trench;
    forming a conductive layer covering on the hard mask layer and the exposed part of the oxide layer, and filling the conductive layer into the trench;
    performing a chemical mechanical polishing process to remove a portion of the conductive layer on the hard mask layer by using the hard mask layer as a stop layer and leave behind a T-shaped portion of the conductive layer with an insertion portion embedded in the trench and a symmetrical protrusion portion on the substrate; and
    forming a contact plug on the surface of the substrate contacting the T-shaped portion of the conductive layer.

2. The method according to claim 1, wherein the oxide layer is a pad silicon oxide layer.

3. The method according to claim 1, wherein after the hard mask layer is formed, the method further comprises a step of forming a sacrificial layer on the hard mask layer.

4. The method according to claim 1, wherein the hard mask layer is a silicon oxide layer or a silicon nitride layer.

5. The method according to claim 2, wherein the symmetrical protrusion portion of the conductive layer covering a portion of the pad silicon oxide layer on the substrate.

6. The method according to claim 1, wherein the step of performing a thermal oxidation process to form the gate dielectric layer is performed directly after the step of performing the etching back process.

7. The method according to claim 1, wherein the symmetrical protrusion portion on the substrate covering a portion of the source region.

8. The method according to claim 1, wherein the the symmetrical protrusion portion is symmetrical with respect to the insertion portion on the substrate.

9. The method according to claim 1, wherein the etching back process is a wet etching process.

10. The method according to claim 1, wherein the contact plug is attached to the symmetrical protrusion portion of the T-shaped portion of the conductive layer.

11. The method according to claim 1, after the step of performing the chemical mechanical polishing process and before the step of forming the contact plug, further comprising:
    forming a dielectric material layer over the surface of the substrate and the T-shaped portion of the conductive layer; and
    removing a portion of the dielectric material layer and a portion of the oxide layer.

* * * * *